United States Patent
Iwamoto

(10) Patent No.: US 11,190,162 B2
(45) Date of Patent: Nov. 30, 2021

(54) ACOUSTIC WAVE DEVICE, HIGH-FREQUENCY FRONT-END CIRCUIT, AND COMMUNICATION APPARATUS

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/807,304

(22) Filed: Mar. 3, 2020

(65) Prior Publication Data
US 2020/0204150 A1  Jun. 25, 2020

Related U.S. Application Data

(63) Continuation of application No. PCT/JP2018/030084, filed on Aug. 10, 2018.

(30) Foreign Application Priority Data

Sep. 7, 2017 (JP) .............................. JP2017-171892

(51) Int. Cl.
*H03H 9/02* (2006.01)
*H03H 9/72* (2006.01)
(Continued)

(52) U.S. Cl.
CPC .... *H03H 9/02574* (2013.01); *H03H 9/02228* (2013.01); *H03H 9/02559* (2013.01);
(Continued)

(58) Field of Classification Search
CPC .......... H03H 9/02574; H03H 9/02228; H03H 9/02559; H03H 9/02566; H03H 9/02866;
(Continued)

(56) References Cited

U.S. PATENT DOCUMENTS 5,281,882 A   1/1994 Sugai
5,998,907 A   12/1999 Taguchi et al.
(Continued)

FOREIGN PATENT DOCUMENTS

JP   04-343514 A   11/1992
JP   11-055070 A   2/1999
(Continued)

OTHER PUBLICATIONS

Official Communication issued in International Patent Application No. PCT/JP2018/030084, dated Oct. 23, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a semiconductor substrate having a first main surface and a second main surface, a piezoelectric thin film provided directly on or indirectly above the first main surface of the semiconductor substrate, and an IDT electrode provided on the piezoelectric thin film. A semiconductor defining the semiconductor substrate is a high acoustic velocity material in which an acoustic velocity of a bulk wave propagating therethrough is higher than an acoustic velocity of an acoustic wave propagating through the piezoelectric thin film. The semiconductor substrate includes a first region including the first main surface and a second region which is a region other than the first region and includes the second main surface. An electric resistance of the first region is lower than an electric resistance of the second region.

16 Claims, 4 Drawing Sheets

(51) Int. Cl.
*H03H 9/13* (2006.01)
*H03H 9/145* (2006.01)
*H03H 9/56* (2006.01)
*H03H 9/64* (2006.01)

(52) U.S. Cl.
CPC .... *H03H 9/02566* (2013.01); *H03H 9/02866* (2013.01); *H03H 9/131* (2013.01); *H03H 9/14541* (2013.01); *H03H 9/564* (2013.01); *H03H 9/6406* (2013.01); *H03H 9/725* (2013.01)

(58) Field of Classification Search
CPC .... H03H 9/131; H03H 9/14541; H03H 9/564; H03H 9/6406; H03H 9/725
USPC .......................... 333/133, 186, 187, 193–196
See application file for complete search history.

(56) References Cited

U.S. PATENT DOCUMENTS

| | | | |
|---|---|---|---|
| 7,619,494 B2* | 11/2009 | Suzuki | H03H 9/568 333/133 |
| 2001/0035695 A1 | 11/2001 | Kadota et al. | |
| 2005/0077982 A1* | 4/2005 | Funasaka | H03H 9/02574 333/195 |
| 2013/0285768 A1 | 10/2013 | Watanabe et al. | |
| 2016/0126932 A1* | 5/2016 | Nakai | H03H 9/6406 370/277 |

FOREIGN PATENT DOCUMENTS

| | | |
|---|---|---|
| JP | 2002-026687 A | 1/2002 |
| WO | 2012/086639 A1 | 6/2012 |

* cited by examiner

ACOUSTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-171892 filed on Sep. 7, 2017 and is a Continuation Application of PCT Application No. PCT/JP2018/030084 filed on Aug. 10, 2018. The entire contents of each application are hereby incorporated herein by reference.

BACKGROUND OF THE INVENTION

1. Field of the Invention

The present invention relates to an acoustic wave device, a high-frequency front-end circuit, and a communication apparatus.

2. Description of the Related Art

Acoustic wave devices have been widely used for a filter of a cellular phone or the like. Japanese Unexamined Patent Application Publication No. 11-055070 discloses an example of an acoustic wave device. The acoustic wave device includes a laminated substrate in which an auxiliary substrate, an insulating film, and a main substrate are laminated in this order. The main substrate is made of a piezoelectric material such as lithium tantalate. An IDT electrode is provided on the main substrate.

Japanese Unexamined Patent Application Publication No. 11-055070 also describes an acoustic wave device having a laminated substrate in which an auxiliary substrate, a conductive film, and a main substrate are laminated in this order. The conductive film is provided to significantly improve the temperature characteristics of the acoustic wave device by the electric field short circuit effect.

In the acoustic wave device described in Japanese Unexamined Patent Application Publication No. 11-055070, adjustment of a fractional band width may not be easily performed, and deterioration in filter characteristics may occur.

SUMMARY OF THE INVENTION

Preferred embodiments of the present invention provide acoustic wave devices, high-frequency front-end circuits, and communication apparatuses that are each able to easily adjust a fractional band width and effectively confine the energy of an acoustic wave.

An acoustic wave device according to a preferred embodiment of the present invention includes a semiconductor substrate including a first main surface and a second main surface opposite to each other, a piezoelectric thin film provided directly on or indirectly above the first main surface of the semiconductor substrate, and an IDT electrode provided on the piezoelectric thin film. A semiconductor defining the semiconductor substrate is a high acoustic velocity material in which an acoustic velocity of a bulk wave propagating therethrough is higher than an acoustic velocity of an acoustic wave propagating through the piezoelectric thin film. The semiconductor substrate includes a first region which includes the first main surface and a second region which is a region other than the first region and includes the second main surface. An electric resistance of the first region is lower than an electric resistance of the second region.

An acoustic wave device according to another preferred embodiment of the present invention includes a semiconductor substrate including a first main surface and a second main surface opposite to each other, a high acoustic velocity film provided on the first main surface of the semiconductor substrate, a low acoustic velocity film provided on the high acoustic velocity film, a piezoelectric thin film provided on the low acoustic velocity film, and an IDT electrode provided on the piezoelectric thin film. An acoustic velocity of a bulk wave propagating through the high acoustic velocity film is higher than an acoustic velocity of an acoustic wave propagating through the piezoelectric thin film, and an acoustic velocity of a bulk wave propagating through the low acoustic velocity film is lower than the acoustic velocity of the acoustic wave propagating through the piezoelectric thin film. The semiconductor substrate includes a first region which includes the first main surface and a second region which is a region other than the first region and includes the second main surface. An electric resistance of the first region is lower than an electric resistance of the second region.

A high-frequency front-end circuit according to a preferred embodiment of the present invention includes an acoustic wave device according to a preferred embodiment of the present invention and a power amplifier.

A communication apparatus according to a preferred embodiment of the present invention includes a high-frequency front-end circuit according to a preferred embodiment of the present invention and an RF signal processing circuit.

According to preferred embodiments of the present invention, it is possible to provide acoustic wave devices, high-frequency front-end circuits, and communication apparatuses that are each able to easily adjust a fractional band width and effectively confine the energy of an acoustic wave.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing preferred embodiments with reference to accompanying drawings.

Note that the preferred embodiments described herein are illustrative and that partial substitutions or combinations of configurations are possible between different preferred embodiments.

Figure 1:
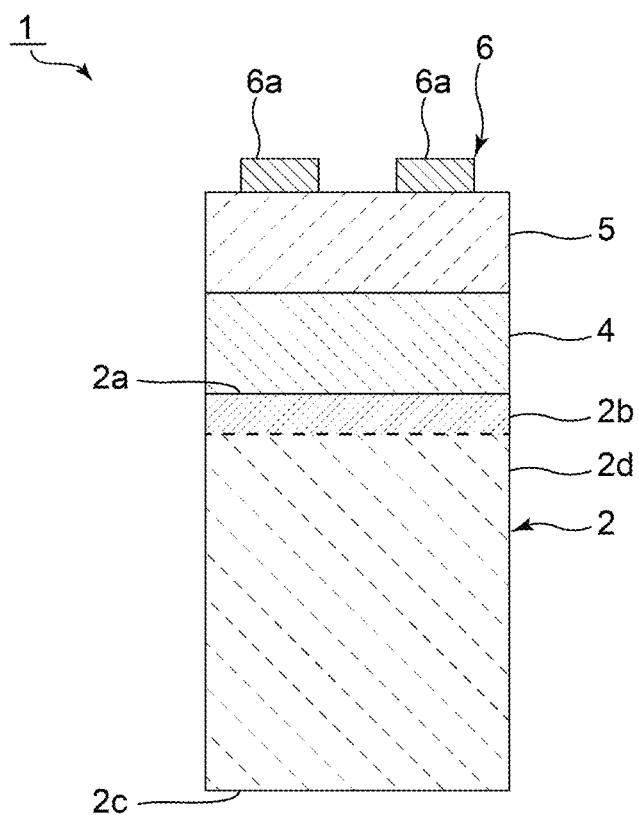
FIG. 1 is an elevational sectional view of an acoustic wave device according to a first preferred embodiment of the present invention.

FIG. 1 is an elevational sectional view of an acoustic wave device according to a first preferred embodiment of the present invention.

An acoustic wave device 1 includes a semiconductor substrate 2. The semiconductor substrate 2 may preferably include a group IV semiconductor (for example, Si, Ge, or the like), a compound semiconductor (for example, ZnSe, CdS, ZnO, $Al_2O_3$, GaAs, InP, GaN, SiC, SiGe, $CuInSe_2$, or the like), or an organic semiconductor, and not particularly limited. Silicon (Si), for example, is preferably used in the first preferred embodiment. Si has good workability, and has a small coefficient of linear expansion and high thermal conductivity. Therefore, Si is suitable as a supporting substrate of the acoustic wave device 1. A low acoustic velocity film 4 is provided on the semiconductor substrate 2. A piezoelectric thin film 5 is provided on the low acoustic velocity film 4. Here, the low acoustic velocity film 4 is a film in which the acoustic velocity of a bulk wave propagating therethrough is lower than the acoustic velocity of the acoustic wave propagating through the piezoelectric thin film 5.

The piezoelectric thin film 5 is preferably made of, for example, lithium tantalate ($LiTaO_3$) having a cut-angle of about 50° Y. The cut-angle of the piezoelectric thin film 5 is not limited to the above. Further, the piezoelectric thin film 5 may be made of a piezoelectric single crystal, for example, lithium niobate ($LiNbO_3$) or a suitable piezoelectric ceramic. Specifically, as a material of the piezoelectric thin film 5, for example, lithium tantalate ($LiTaO_3$), lithium niobate ($LiNbO_3$), zinc oxide (ZnO), aluminum nitride (AlN), quartz ($SiO_2$), or sapphire may preferably be used.

The low acoustic velocity film 4 is preferably made of an oxide in the first preferred embodiment. Specifically, the low acoustic velocity film 4 is preferably made of silicon oxide ($SiO_2$), for example. The low acoustic velocity film 4 is not limited to $SiO_2$, and may be made of silicon oxide which is represented by $SiO_x$ and x is an integer other than 2. Note that the low acoustic velocity film 4 is not limited to the above, and may be made of any material having a relatively low acoustic velocity. For example, a glass, silicon oxynitride, tantalum oxide, a compound obtained by adding fluorine, carbon, or boron to silicon oxide, or a medium including these materials as a main component can be used.

On the other hand, Si which is a semiconductor defining the semiconductor substrate 2 is a high acoustic velocity material in which the acoustic velocity of the bulk wave propagating therethrough is higher than the acoustic velocity of the acoustic wave propagating through the piezoelectric thin film 5 (lithium tantalate). Therefore, in the first preferred embodiment, the semiconductor substrate 2 is the high acoustic velocity substrate in which the acoustic velocity of the bulk wave propagating therethrough is higher than the acoustic velocity of the acoustic wave propagating through the piezoelectric thin film 5. Even when the piezoelectric thin film 5 made of lithium niobate, zinc oxide, aluminum nitride, quartz, or sapphire, the semiconductor substrate 2 made of Si can be used as the high acoustic velocity substrate.

Here, the semiconductor substrate 2 includes a first region 2b and a second region 2d. The first region 2b is a region including a first main surface 2a close to the low acoustic velocity film 4. The second region includes a second main surface 2c opposed to the first main surface 2a, and is a region excluding the first region 2b. Note that the first region 2b is a surface region. The first region 2b, which is a surface region, is the region having the distance of about 1 μm or less from the surface. The second region is a bulk region excluding the surface region. The first region 2b is a low resistance portion having electric resistance lower than the electric resistance of the second region 2d. Specifically, the average value of the electric resistance of the low resistance portion is lower than the average value of the electric resistance of the bulk region in the semiconductor substrate 2. The electric resistance of the second region 2d is not particularly limited, and is preferably larger than or equal to about 1000 Ω·cm, and more preferably larger than or equal to about 4000 Ω·cm, for example. The resistance value of the first region 2b is not particularly limited, and is preferably smaller than or equal to about 1000 Ω·cm, for example.

To form the low resistance portion, for example, a dopant such as phosphorus or boron may be doped adjacent to or in a vicinity of the first main surface 2a of the semiconductor substrate 2. The method of forming the low resistance portion is not limited to the above.

As shown in FIG. 1, an IDT electrode 6 is provided on the piezoelectric thin film 5. When an AC voltage is applied to the IDT electrode 6, the acoustic wave is excited. The IDT electrode 6 includes a plurality of electrode fingers 6a. In FIG. 1, the IDT electrode 6 is shown, and the IDT electrode 6 includes more than two electrode fingers 6a. The IDT electrode 6 is preferably made of, for example, aluminum (Al). The IDT electrode 6 may be made of any suitable metal other than the above. The IDT electrode 6 may include a single-layer metal film or may include a laminated metal film in which a plurality of metal layers are laminated. The IDT electrode 6 may include an alloy including a plurality of metal elements or may include a compound including a metal element and a non-metal element.

According to the first preferred embodiment, provided is the multilayer body in which the semiconductor substrate 2 as the high acoustic velocity substrate where the acoustic velocity of the bulk wave propagating therethrough is higher than the acoustic wave propagating through the piezoelectric thin film 5, the low acoustic velocity film 4, and the piezoelectric thin film 5. In addition to that, the semiconductor substrate 2 includes the low resistance portion, which is the region close to the piezoelectric thin film 5 and including the first main surface 2a of the semiconductor substrate 2. With the multilayer body stated above, the energy of the acoustic wave can be effectively confined. In addition, since the semiconductor substrate 2 includes the low resistance portion, the fractional band width can be easily adjusted. The adjustment of the fractional band width will be described below in detail.

The acoustic wave device according to the first preferred embodiment and an acoustic wave device of a comparative example were produced, and impedance characteristics thereof were compared. Note that the acoustic wave device of the comparative example has the same or similar features as that of the first preferred embodiment, except that the semiconductor substrate does not include the low resistance portion.

The acoustic wave device according to the first preferred embodiment and the comparative example have following conditions. Here, the wavelength defined by the electrode finger pitch of the IDT electrode is taken as $\lambda$.

Figure 2:
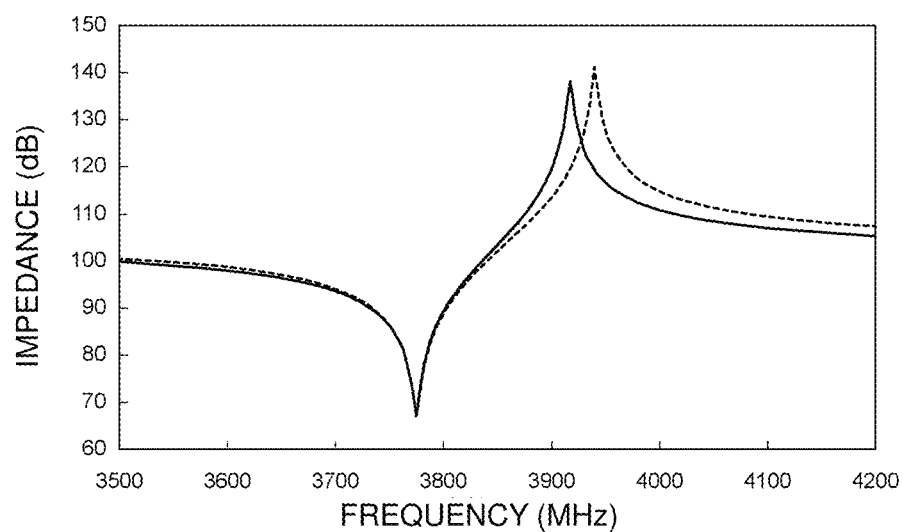
FIG. 2 is a diagram describing impedance characteristics of acoustic wave devices according to the first preferred embodiment of the present invention and a comparative example.

Semiconductor substrate: material Si
Low acoustic velocity film: material $SiO_2$, film thickness about $0.2\lambda$
Piezoelectric thin film: material $LiTaO_3$, cut angle about 50° Y, film thickness about $0.1\lambda$
IDT electrode: material Al, film thickness $0.08\lambda$, duty about 0.5
Wavelength $\lambda$: about 1 μm FIG. 2 is a diagram describing impedance characteristics of acoustic wave devices according to the first preferred embodiment and the comparative example. In FIG. 2, a solid line indicates the result of the first preferred embodiment, and a broken line indicates the result of the comparative example.

As described in FIG. 2, in the first preferred embodiment and the comparative example, the resonant frequencies are the same or substantially the same. On the other hand, the anti-resonant frequency in the first preferred embodiment is lower than the anti-resonant frequency in the comparative example. Therefore, in the first preferred embodiment, the fractional band width is narrowed. Thus, for example, it is possible to significantly improve the steepness of the pass band of the band pass filter including the acoustic wave device of the first preferred embodiment.

Figure 3:
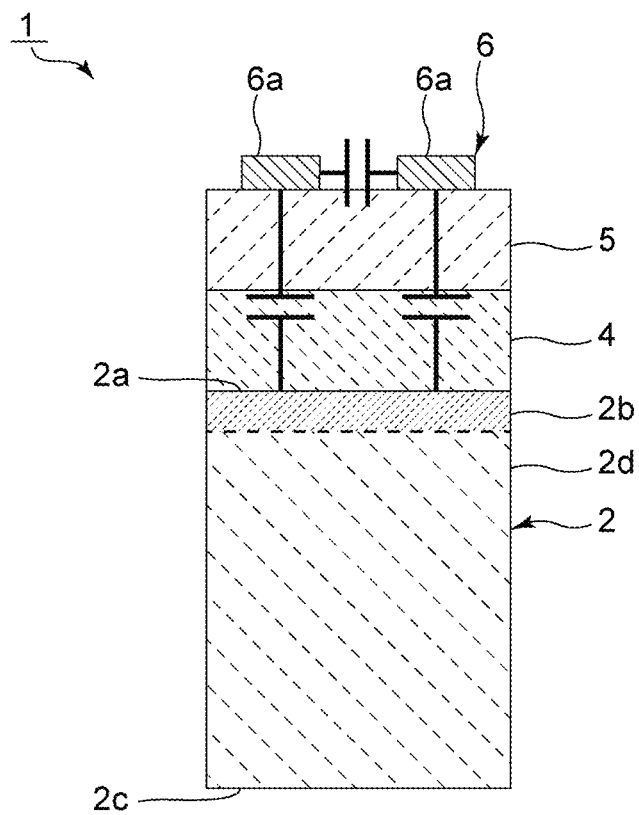
FIG. 3 is an elevational sectional view showing electrostatic capacitance in the acoustic wave device according to the first preferred embodiment of the present invention.

FIG. 3 is an elevational sectional view showing an electrostatic capacitance in the acoustic wave device according to the first preferred embodiment.

As shown in FIG. 3, the electrostatic capacitance is generated between the electrode fingers 6a of the IDT electrode 6. In addition, since the semiconductor substrate 2 of the first preferred embodiment includes the low resistance portion, the electrostatic capacitance is also generated between the first region 2b as the low resistance portion and the IDT electrode 6. With this, in the first preferred embodiment, the fractional band width is reduced. Since the electrostatic capacitance can be adjusted by adjusting the film thickness of the piezoelectric thin film 5, the fractional band width can be easily adjusted. This will be described below.

A plurality of acoustic wave devices of the first preferred embodiment and a plurality of acoustic wave devices of the comparative example were produced by setting the film thickness of the piezoelectric thin films to be different from each other. BW ratio was defined as the value in which the band width in the first preferred embodiment was divided by the band width in the comparative example where film thicknesses of the piezoelectric thin films were the same or substantially the same, and the relationship between the BW ratio and the film thickness of the piezoelectric thin film was examined. The film thickness of the piezoelectric thin film was varied from about $0.01\lambda$ to about $25\lambda$.

Figure 4:
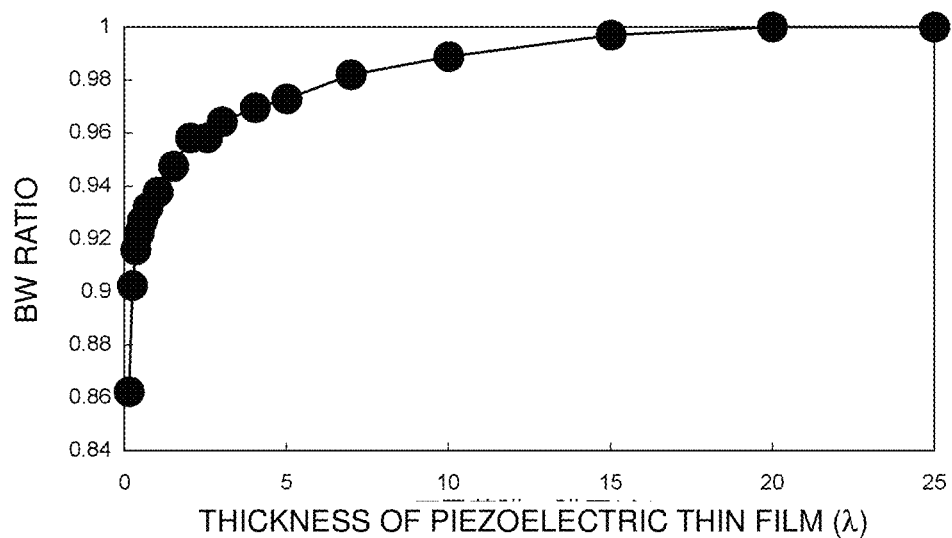
FIG. 4 is a diagram describing the relationship between the film thickness of the piezoelectric thin film and the BW ratio.

FIG. 4 is a diagram describing the relationship between the film thickness of the piezoelectric thin film and the BW ratio.

As described in FIG. 4, the BW ratio becomes smaller as the film thickness of the piezoelectric thin film becomes thinner. Therefore, it is understood that the smaller the film thickness of the piezoelectric thin film is, the narrower the fractional band width is in the first preferred embodiment.

Accordingly, by adjusting the film thickness of the piezoelectric thin film, it is possible to easily adjust the fractional band width.

It is preferable that the piezoelectric thin film has the film thickness of about $15\lambda$ or less, for example. In this case, the fractional band width can be adjusted more easily.

In the first preferred embodiment, the electrostatic capacitance is generated between the IDT electrode and the low resistance portion of the semiconductor substrate in addition to the electrostatic capacitance between the electrode fingers of the IDT electrode. Thus, the electrostatic capacitance can be sufficiently increased without increasing the area of the IDT electrode. Therefore, the acoustic wave device 1 is able to be easily reduced in size.

Here, the capacitance ratio was defined as the value in which the electrostatic capacitance in the first preferred embodiment was divided by the electrostatic capacitance in the comparative example where the film thicknesses of the piezoelectric thin films were the same or substantially the same, and the relationship between the capacitance ratio and the film thickness of the piezoelectric thin film was examined.

Figure 5:
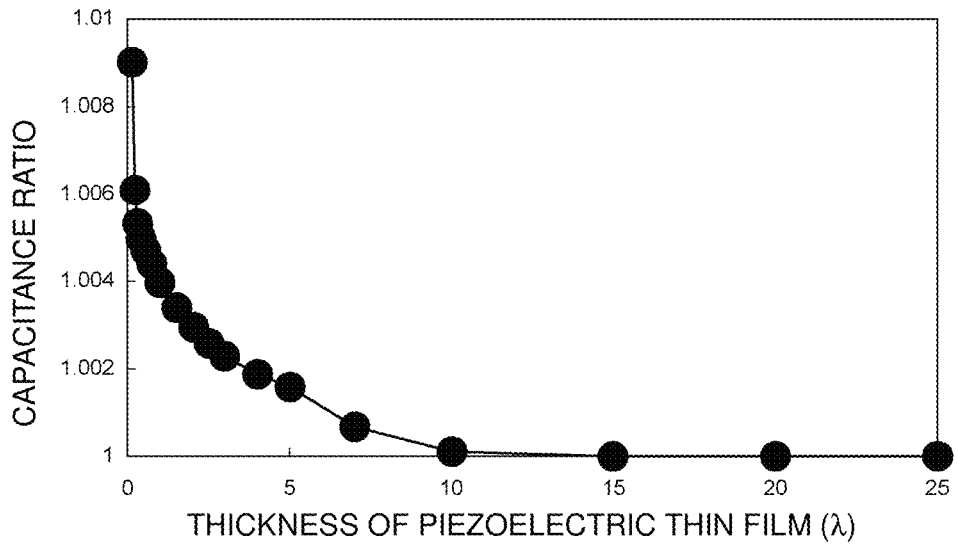
FIG. 5 is a diagram describing the relationship between the film thickness of the piezoelectric thin film and the capacitance ratio.

FIG. 5 is a diagram describing the relationship between the film thickness of the piezoelectric thin film and the capacitance ratio.

As shown in FIG. 5, the capacitance ratio becomes larger as the film thickness of the piezoelectric thin film becomes thinner. It is preferable that the thickness of the piezoelectric thin film is about $10\lambda$ or less, for example. Thus, the electrostatic capacity in the first preferred embodiment can be further increased, and the acoustic wave device 1 is able to be easily reduced in size.

Figure 8:
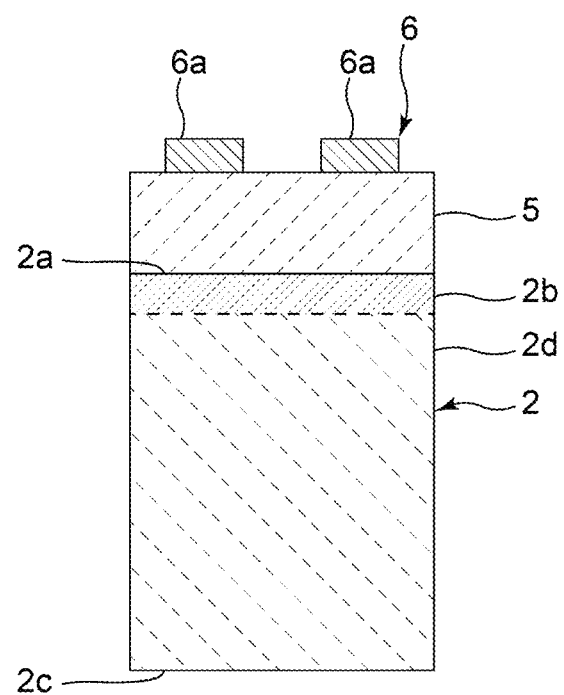
FIG. 8 is an elevational sectional view of an acoustic wave device according to a modification of the first preferred embodiment of the present invention.

In the above multilayer body of the first preferred embodiment shown in FIG. 1, the piezoelectric thin film 5 is indirectly provided above the semiconductor substrate 2 with the low acoustic velocity film 4 interposed therebetween. Note that the multilayer body is not limited to such a three-layer configuration. In the multilayer body of the modification of the first preferred embodiment shown in FIG. 8, the piezoelectric thin film 5 is directly provided on the semiconductor substrate 2. In this way, even when the multilayer body includes two layers, the energy of the acoustic wave can be effectively confined, and the fractional band width can be easily adjusted.

Figure 6:
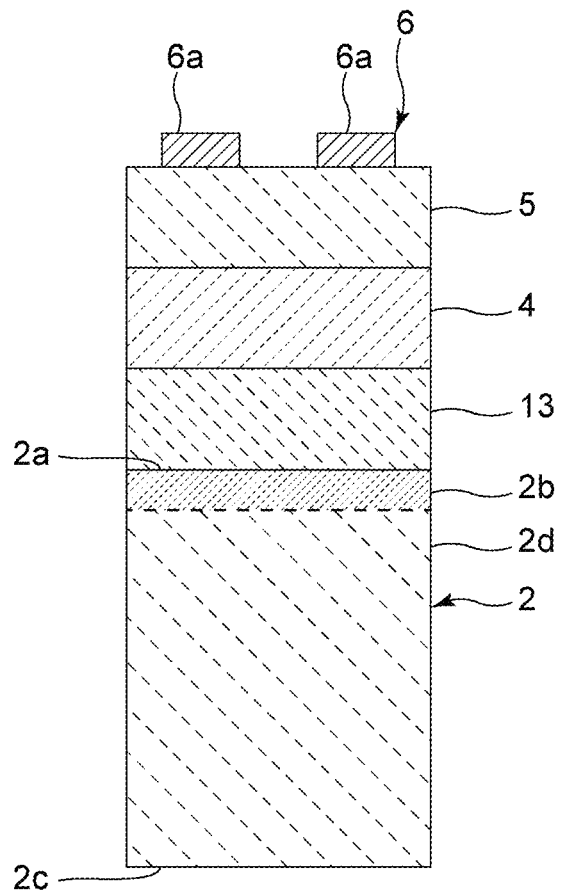
FIG. 6 is an elevational sectional view of an acoustic wave device according to a second preferred embodiment of the present invention.

FIG. 6 is an elevational sectional view of an acoustic wave device according to a second preferred embodiment of the present invention.

The second preferred embodiment is different from the first preferred embodiment in that a high acoustic velocity film 13 is provided between the semiconductor substrate 2 and the low acoustic velocity film 4. Except the above, the acoustic wave device according to the second preferred embodiment has the same or similar features as the features of the acoustic wave device 1 according to the first preferred embodiment. Here, the high acoustic velocity film 13 refers to the film in which the acoustic velocity of the bulk wave propagating therethrough is higher than the acoustic velocity of the acoustic wave propagating through the piezoelectric thin film 5.

The high acoustic velocity film 13 is made of, for example, a material including aluminum oxide, silicon oxynitride, or the like as a main component. The high acoustic velocity film 13 is preferably made of, for example, an oxide. Note that the material of the high acoustic velocity film 13 may be any material having a relatively high acoustic velocity. Examples of such material include various ceramics, for example, aluminum nitride, silicon carbide, silicon nitride, silicon oxynitride, silicon, amorphous silicon, polysilicon, gallium nitride, DLC, diamond, sapphire, alumina, cordierite, mullite, steatite, forsterite, or the like, magnesia, diamond, or materials including these materials as a main component, and materials including mixtures of these materials as a main component, or the like.

The acoustic wave device of the second preferred embodiment includes the multilayer body in which the high acoustic velocity film 13, the low acoustic velocity film 4, and the piezoelectric thin film 5 are laminated, and the semiconductor substrate 2 includes the first region 2b as the low resistance portion. Therefore, as in the first preferred embodiment, it is possible to easily adjust the fractional band width, and effectively confine the energy of the acoustic wave.

The acoustic wave devices of the preferred embodiments can each be used as a duplexer of a high-frequency front-end circuit or the like. An example will be described below.

Figure 7:
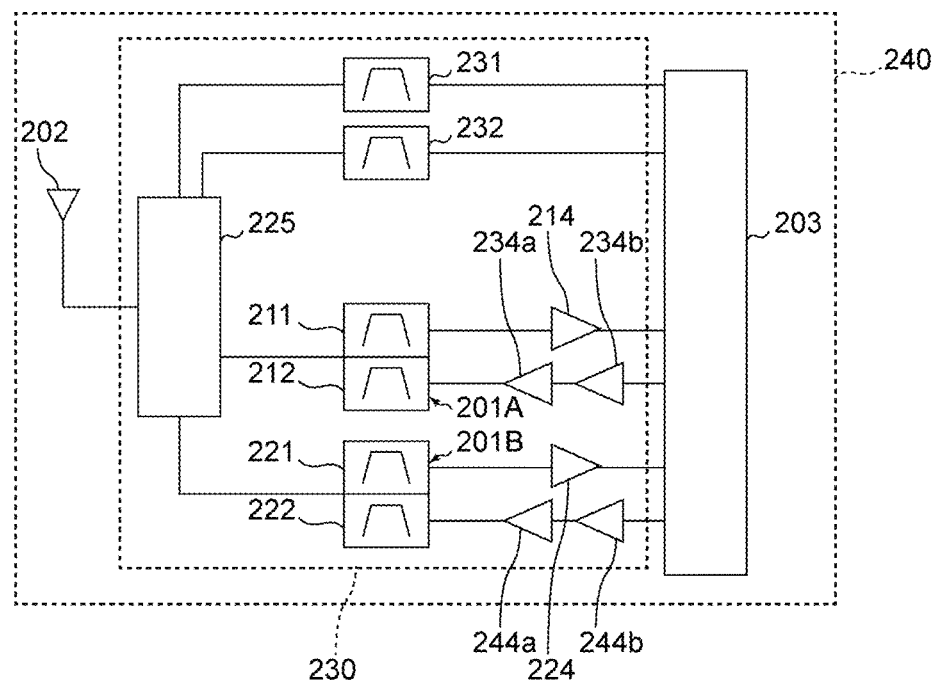
FIG. 7 is a diagram of a communication apparatus including a high-frequency front-end circuit according to a preferred embodiment of the present invention.

FIG. 7 is a diagram of a communication apparatus and a high-frequency front-end circuit according to a preferred embodiment of the present invention. In FIG. 7, elements electrically connected to a high-frequency front-end circuit 230, for example, an antenna device 202 and an RF signal processing circuit (RFIC) 203, are also shown. The high-frequency front-end circuit 230 and the RF signal processing circuit 203 define a communication apparatus 240. The communication apparatus 240 may include a power supply, a CPU, a display, and the like.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. Note that the high-frequency front-end circuit 230 and the communication apparatus 240 shown in FIG. 7 are an example of the high-frequency front-end circuit and the communication apparatus, and are not limited to the above-described features.

The duplexer 201A includes filters 211 and 212. The duplexer 201B includes filters 221 and 222. The duplexers 201A and 201B are electrically connected to the antenna device 202 via the switch 225. The above-discussed acoustic wave device may be the duplexers 201A and 201B, or may be the filters 211, 212, 221, and 222.

Further, an acoustic wave device according to a preferred embodiment of the present invention may be applied to, for example, a multiplexer including three or more filters, for example, a triplexer in which an antenna terminal for three filters is shared and a hexaplexer in which an antenna terminal for six filters is shared.

That is, the acoustic wave devices according to preferred embodiments of the present invention include an acoustic wave resonator, a filter, a duplexer, and a multiplexer having three or more filters. The multiplexer is not limited to a configuration that includes both a transmission filter and a reception filter, and may be include only a transmission filter or a reception filter.

The switch 225 electrically connects the antenna device 202 to a signal path corresponding to a predetermined band in accordance with a control signal from a controller (not shown), and is defined by, for example, a single pole double throw (SPDT) type switch. Note that the number of signal paths electrically connected to the antenna device 202 is not limited to one, and a plurality of signal paths may be electrically connected. In other words, the high-frequency front-end circuit 230 may support carrier aggregation.

The low-noise amplifier circuit 214 is a reception amplifier circuit that amplifies a high frequency signal (a high frequency reception signal in this case) coming through the antenna device 202, the switch 225, and the duplexer 201A, and outputs the amplified high frequency signal to the RF signal processing circuit 203. The low-noise amplifier circuit 224 is a reception amplifier circuit that amplifies a high frequency signal (a high frequency reception signal in this case) coming through the antenna device 202, the switch 225, and the duplexer 201B, and outputs the amplified high frequency signal to the RF signal processing circuit 203.

The power amplifier circuits 234a and 234b are transmission amplifier circuits that amplify a high frequency signal (a high frequency transmission signals in this case) output from the RF signal processing circuit 203, and output the amplified high frequency signal to the antenna device 202 via the duplexer 201A and the switch 225. The power amplifier circuits 244a and 244b are transmission amplifier circuits that amplify a high frequency signal (a high frequency transmission signals in this case) output from the RF signal processing circuit 203, and output the amplified high frequency signal to the antenna device 202 via the duplexer 201B and the switch 225.

The RF signal processing circuit 203 performs signal processing, by down-conversion or the like, for example, on a high frequency reception signal input from the antenna device 202 through a reception signal path, and outputs a reception signal having been generated by the signal processing. The RF signal processing circuit 203 performs signal processing, by up-conversion or the like, for example, on an input transmission signal, and outputs a high frequency transmission signal having been generated by the signal processing to the power amplifier circuits 234a, 234b, 244a, and 244b. The RF signal processing circuit 203 is preferably, for example, an RFIC. The communication apparatus may include a baseband (BB) IC. In this case, the BBIC performs signal processing on the reception signal having been processed by the RFIC. Further, the BBIC performs signal processing on a transmission signal and outputs the signal to the RFIC. The reception signal having been processed by the BBIC or the transmission signal before the signal processing by the BBIC are, for example, an image signal, a sound signal, or the like.

The high-frequency front-end circuit 230 may include duplexers according to a modification of the duplexers 201A and 201B in place of the duplexers 201A and 201B.

On the other hand, the filters 231 and 232 in the communication apparatus 240 are electrically connected between the RF signal processing circuit 203 and the switch 225 without passing through the low-noise amplifier circuits 214 and 224 and the power amplifier circuits 234a, 234b, 244a, and 244b. The filters 231 and 232 are also electrically connected to the antenna device 202 via the switch 225, similarly to the duplexers 201A and 201B.

According to the high-frequency front-end circuit 230 and the communication apparatus 240 with the features described above, by providing an acoustic wave resonator, a filter, a duplexer, a multiplexer including three or more filters, or the like, which are each acoustic wave devices according to a preferred embodiment of the present invention, it is possible to easily adjust the fractional band width and effectively confine the energy of the acoustic wave.

Thus far, the acoustic wave devices, the high-frequency front-end circuits, and the communication apparatuses according to the preferred embodiments of the present invention have been described with reference to the above preferred embodiments and the modification thereof. The present invention further includes other preferred embodiments obtained by combining any appropriate elements of the above preferred embodiments and modification, modifications obtained by applying variations conceived by those skilled in the art on the above preferred embodiments without departing from the spirit and scope of the present invention, various apparatuses incorporating the high-frequency front-end circuit and the communication apparatus according to the present invention.

Preferred embodiments of the present invention may be widely used in communication devices, for example, cellular phones, as an acoustic wave resonator, a filter, a duplexer, a multiplexer applicable to a multi-band system, a front-end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a semiconductor substrate including a first main surface and a second main surface opposite to each other;
    a high acoustic velocity film on the first main surface of the semiconductor substrate;
    a low acoustic velocity film on the high acoustic velocity film;
    a piezoelectric thin film on the low acoustic velocity film; and
    an IDT electrode on the piezoelectric thin film; wherein
    an acoustic velocity of a bulk wave propagating through the high acoustic velocity film is higher than an acoustic velocity of an acoustic wave propagating through the piezoelectric thin film;
    an acoustic velocity of a bulk wave propagating through the low acoustic velocity film is lower than the acoustic velocity of the acoustic wave propagating through the piezoelectric thin film;
    the semiconductor substrate includes a first region which includes the first main surface and a second region which is a region other than the first region and includes the second main surface; and
    an electric resistance of the first region is lower than an electric resistance of the second region.

2. The acoustic wave device according to claim 1, wherein the first region is a region where a distance from the first main surface is about 1 µm or less.

3. The acoustic wave device according to claim 1, wherein a wavelength defined by an electrode finger pitch of the IDT electrode is λ; and a thickness of the piezoelectric thin film is about 15λ or less.

4. The acoustic wave device according to claim 1, wherein a wavelength defined by an electrode finger pitch of the IDT electrode is λ; and a thickness of the piezoelectric thin film is about 10λ or less.

5. The acoustic wave device according to claim 1, wherein an average electric resistance value of the first region is smaller than an average electric resistance value of the second region.

6. The acoustic wave device according to claim 1, wherein the semiconductor substrate is made of silicon.

7. The acoustic wave device according to claim 6, wherein the semiconductor substrate includes a single crystal.

8. The acoustic wave device according to claim 1, wherein a material of the piezoelectric thin film is lithium tantalate or lithium niobate.

9. The acoustic wave device according to claim 1, wherein the high acoustic velocity film is made of an oxide.

10. The acoustic wave device according to claim 1, wherein the low acoustic velocity film is made of an oxide.

11. The acoustic wave device according to claim 10, wherein the low acoustic velocity film is made of silicon oxide.

12. A high-frequency front-end circuit comprising:
    an acoustic wave device according to claim 1; and
    a power amplifier.

13. A communication apparatus comprising:
    the high-frequency front-end circuit according to claim 12; and
    an RF signal processing circuit.

14. The high-frequency front-end circuit according to claim 12, further comprising:
    at least one duplexer,
    at least one filter, and
    at least one low-noise amplifier.

15. The acoustic wave device according to claim 1, wherein
    an average electric resistance value of the first region is larger than or equal to about 4000 Ω·cm; and
    an average electric resistance value of the second region is smaller than or equal to about 1000 Ω·cm.

16. The acoustic wave device according to claim 1, wherein
    the IDT electrode includes a plurality of electrode fingers; and
    when an AC voltage is applied to the IDT electrode, the acoustic wave is excited.

* * * * *